United States Patent [19]
Herrero et al.

[11] Patent Number: 4,675,717
[45] Date of Patent: Jun. 23, 1987

[54] WATER-SCALE-INTEGRATED ASSEMBLY

[75] Inventors: Victor Herrero, Somerset; Leonard W. Schaper, West Orange, both of N.J.

[73] Assignee: American Telephone and Telegraph Company, AT&T Bell Laboratories, Murray Hill, N.J.

[21] Appl. No.: 658,799

[22] Filed: Oct. 9, 1984

[51] Int. Cl.[4] .......................................... H01L 23/48
[52] U.S. Cl. ...................................... 357/71; 357/51; 357/45; 357/40; 357/80
[58] Field of Search .................. 357/71, 80, 51, 45, 357/40, 43

[56] References Cited

U.S. PATENT DOCUMENTS

| | | | |
|---|---|---|---|
| 4,293,587 | 10/1981 | Trueblood | 357/71 X |
| 4,467,400 | 8/1984 | Stopper | 361/403 |
| 4,471,483 | 9/1984 | Chamberlain | 371/11 X |
| 4,484,215 | 11/1984 | Pappas | 357/74 X |
| 4,489,397 | 12/1984 | Lee | 364/900 |
| 4,493,055 | 1/1985 | Osman | 365/78 |

FOREIGN PATENT DOCUMENTS 55-86144  6/1980  Japan ..................................... 357/75

OTHER PUBLICATIONS

Bodendorf et al, "Active Silicon Chip Carrier", IBM Technical Disclosure Bulletin, vol. 15, No. 2, Jul. 1972, pp. 656-657.
Kraynak et al, "Wafer-Chip Assembly for Large-Scale Integration," IEEE Transactions on Electron Devices, vol. ED-15, No. 9, Sep. 1968, pp. 660-663.
D. L. Peltzer, "Wafer-Scale Integration: The Limits of VLSI?", VLSI Design, Sep. 1983, pp. 43-47.
C. Huang, "Silicon Packaging-A New Packaging Technique", IEEE Custom Integrated Circuits Conference, Rochester, New York, May 24, 1983, pp. 142-146.
Y. Egawa et al, "A 1-Mbit Full-Wafer MOS RAM," IEEE Transactions on Electron Devices, vol. ED—27, No. 8, Aug. 1980, pp. 1612-1621.

Primary Examiner—Martin H. Edlow
Assistant Examiner—William A. Mintel
Attorney, Agent, or Firm—Lucian C. Canepa

[57] ABSTRACT

The standard silicon wafer of a conventional wafer-scale-integrated assembly is doped to render it highly conductive. Additionally, a conductive layer is formed on the bottom of the water. The bottom-side layer forms an easily accessible ground plane of the assembly. Moreover, this layer and the conductive silicon constitute one plate of an advantageous wafer-size decoupling capacitor. A nearly continuous power layer and a relatively thick layer of silicon dioxide on the top side of the assembly form the other elements of the decoupling capacitor. Additionally, the nearly continuous power layer constitutes an effective a-c ground plane for overlying signal lines.

32 Claims, 5 Drawing Figures

WATER-SCALE-INTEGRATED ASSEMBLY

BACKGROUND OF THE INVENTION

This invention relates to integrated-circuit chips and, more particularly, to an assembly that includes multiple such chips interconnected by means of a multilevel conductive pattern formed on a wafer.

It is known to utilize a pattern of lithographically formed conductors of semiconductor chips. In some cases, the chips to be interconnected are mounted on the surface of the wafer or in recesses formed in the wafer surface. In other cases, the chips are formed in the wafer as integral parts thereof. Herein, all of these and similar arrangements will be referred to as wafer-scale-integrated (WSI) assemblies.

WSI assemblies are potentially faster than approaches based on individually packaged chips mounted and interconnected on a standard printed-circuit board. In such a standard assembly, the size of the chip package limits the density of circuits in a system. By contrast, in a WSI assembly, unpackaged chips can be packed extremely closed on a single wafer, thus avoiding the major size limitations imposed by package size and thereby enabling faster performance due to substantial decreases in chip interconnection lengths.

WSI assemblies can also improve system reliability. This is so because the major failure sites in conventional electronic assemblies are the connections between different packaging levels: for example, between chips and packages, between packages and boards, and between boards and cables. In a WSI assembly, the placement and interconnection of multiple chips on a single wafer in an integrated array greatly reduces the number and type of these interlevel connections.

In a WSI assembly, it is known that it is desirable to include large-area power and ground conductors in the conductive pattern formed on one surface of the wafer. Separate power and ground metallization planes at respectively different levels would be ideal from an electrical standpoint. But since separate X- and Y-signal metallization levels are also typically required in the assembly, the electrically ideal structure would include four separate metallization levels on the one surface of the wafer. However, such a four-level-metallization structure is quite complex from a fabrication standpoint.

Therefore, in practice, one feasible WSI assembly includes large-area power and ground conductors suitably separated from each other in a common plane in a three-level-metallization structure formed on one surface of the wafer. While not electrically ideal, such a structure is considerably easier and less costly to manufacture than a four-level-metalization one.

Virtually all WSI assemblies require decoupling capacitors. It is known to include such a capacitor under or adjacent to each chip on the wafer. For high-speed operation, it is vital that these capacitors be located as close as possible to their respective chips. But even relatively short leads extending between a decoupling capacitor and its associated chip may have sufficient inductance to deleteriously affect the performance of very-high-speed circuits. Additionally, the intrinsic inductance of the multiple individual capacitors also tends to limit the speed of operation of the circuits includes in the WSI assembly.

Accordingly, considerable technical efforts have been directed at trying to improve the structure and performance of WSI assemblies. It was recognized that these efforts, if successful, had the potential for providing improved highly reliable low-cost electronic systems characterized by extremely high speed.

SUMMARY OF THE INVENTION

Hence, an object of the present invention is an improved WSI assembly. More specifically, an object of this invention is a more simply fabricated and more reliable such assembly characterized by an improved power-ground distribution structure that also enables the attainment in the assembly of an advantageous large-area decoupling capacitor.

Briefly, these and other objects of the present invention are realized in a specific illustrative embodiment thereof that comprises a silicon wafer that is highly doped to render it relatively conductive. A substantially planar and continuous power metallization layer is formed overlying the top surface of the wafer. At the same time that the power metallization layer is formed, a continuous ground metallization layer is formed on the bottom surface of the wafer. Spaced-apart X- and Y-signal metallization layers are then formed overlying the top surface. The resulting WSI assembly thus includes three metallization layers on the top surface of the wafer and one such layer on the bottom surface thereof. Interconnected chips of the assembly are included on the top surface of the wafer.

The illustrative assembly also comprises a dielectric layer underlying a major extent of the power metallization layer. The power layer thus constitutes one plate of a wafer-size capacitor. The conductive wafer itself and the bottom-surface ground layer form the other plate of this capacitor. Hence, whenever an electrical connection is made between a pad on the chip and the power layer, the wafer-size capacitor is also thereby connected to the chip in a low-inductance way to provide effective decoupling.

Additionally, advantageous ground connections are also easily made in the illustrative WSI assembly. This is done, for example, by means of isolated metallic portions of the power layer that are formed directly on the top surface of the wafer. Whenever an electrical connection is made between a pad on the chip and one of these isolated metallic portions, an effective ground connection is thereby made to the pad via the conductive wafer and the bottom-surface ground layer.

Other isolated metallic portions of the power layer comprise the instrumentalities by which the X- and Y-signal layers are selectively connected to specified pads on the chips.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
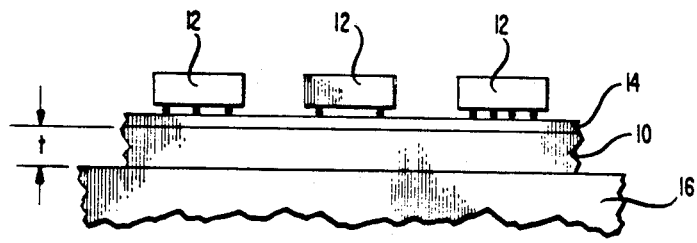
FIG. 1 is a generalized overall schematic representation of a conventional WSI assembly.

The conventional WSI assembly represented in FIG. 1 comprises a wafer 10 made of silicon having a thickness t of approximately 500 micrometers ($\mu$m). By way of example, the wafer 10 is square, measuring about 7.5 centimeters (cm) on a side. The resistivity of the conventional wafer 10 is relatively high, being, for example, greater than ten ohm-centimeter.

For assembly interconnection purposes, it is usually desired to provide a square wafer. But to maximize the available wafer area, it is advantageous in some cases to provide a generally square wafer with rounded corners, as shown, for example, in FIG. 13 on page 1619 of "A 1-Mbit Full-Wafer MOS RAM," *IEEE Transactions on Electron Devices*, Volume ED-27, No. 8, August 1980, page 1612.

A number of standard integrated-circuit chips 12 are included in the FIG. 1 assembly. Advantageously, the chips are also made of silicon thereby to achieve a chip/wafer assembly with a matched coefficient of thermal expansion. Illustratively, each chip is also about 500 $\mu$m thick and is square, measuring about 0.6 cm on a side.

A number of known ways are available for incorporating the chips 12 in the assembly depicted in FIG. 1. The particular way that is illustrated in the drawing and that will be emphasized herein involves conventional face-down solder-ball bonding. In this particular technique, microminiature solder posts each about 50 $\mu$m high and having a diameter of approximately 125 $\mu$m are utilized to connect bonding pads on the face of each chip to lithographically defined conductors included in a three-level metallization structure 14 (FIG. 1) formed on the top surface of the wafer 10.

Further, the WSI assembly shown in FIG. 1 is schematically depicted as being associated with a standard package 16. By way of example, the package includes instrumentalities (not shown) for making electrical contact with peripheral portions of the metallization structure 14 on the wafer 10. The package also typically includes a suitable heat sinking arrangement for cooling the assembly.

The standard metallization structure 14 schematically depicted in FIG. 1 includes three levels suitably insulated from each other. One level, which will be described in detail below in connection with FIG. 2, includes spaced-apart planar power and ground conductors. The other two levels respectively contain signal conductors. Typically, the signal conductors in one of these levels are all disposed parallel to each other in the X direction, and the conductors in the other level are disposed parallel to each other in the Y direction. These X-signal and Y-signal conductors are, for example, each about 2 $\mu$m thick and 10-to-20 $\mu$m wide.

By standard integrated circuit fabrication techniques, connections are made between selected ones of the X-signal and Y-signal conductors and between selected signal conductors and patterned portions of the power/ground metallization included in the structure 14 of FIG. 1. Interconnections are also formed from these patterned portions and from the power/ground metallization to contact areas in a chip-mounting site. Thus, when a chip is attached to the wafer-size interconnection assembly (for example, by face-down solder-ball bonding), bonding pads on the chip are thereby connected to selected ones of the power, ground, X-signal and Y-signal conductors of the WSI assembly.

Figure 2:
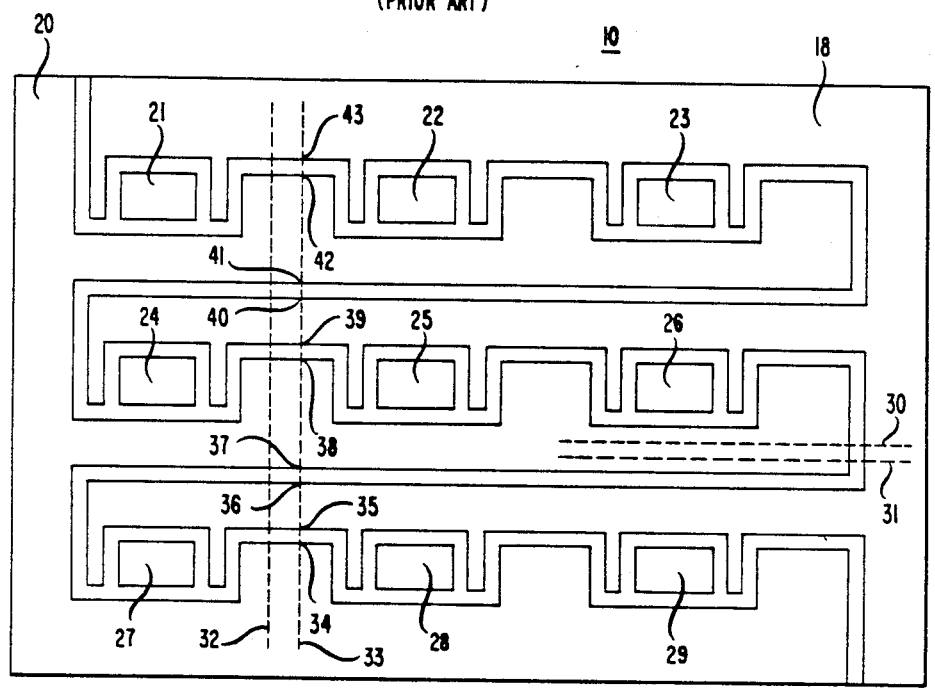
FIG. 2 schematically depicts a three-layer metallization structure as heretofore proposed for an assembly of the FIG. 1 type.

FIG. 2 shows an illustrative single-level power/ground metallization pattern as heretofore proposed. The pattern includes spaced-apart large-area planar conductors 18 and 20. Illustratively, the conductor 18 comprises the power conductor of the depicted WSI assembly and the conductor 20 comprises the ground conductor of the assembly. As indicated in FIG. 2, portions of these power and ground conductors surround each of nine mounted chips 21 through 29.

Two X-signal leads which are formed in a metallization level that overlies the aforedescribed power/ground level are schematically represented in FIG. 2 by dashed lines 30 and 31. Similarly, two Y-signal leads which are formed in yet another overlying metallization level are depicted in FIG. 2 by dashed lines 32 and 33.

In an overall system that includes the WSI assembly shown in FIG. 2, the conductor 20 is connected to a point of reference potential such as d-c ground. The conductor 18 is connected to a positive (or negative) potential with respect to ground. But, since the conductor 18 is also typically connected to ground via decoupling capacitors, the conductor 18 is in effect thereby maintained at a-c ground.

Ideally, the signal leads 30 through 33 should overlie a continuous ground plane. In such an ideal structure, signals propagated in the leads 30 through 33 are minimally distorted.

It is apparent from FIG. 2, however, that the representative signal leads 30 through 33 of the actual depicted WSI assembly overlie discontinuities in the underlying metallization level that includes the power and ground conductors 18 and 20. With respect to the signal lead 33, for example, these discontinuities occur at breaks in the underlying metal. These break points are identified in FIG. 2 by reference numerals 34 through 43. Because of these and similar discontinuities in the underlying metallization, signals propagated in the X and Y leads represented in FIG. 2 suffer distortion. In some systems, this distortion may be sufficient to deleteriously affect the desired operation thereof.

Figure 3:
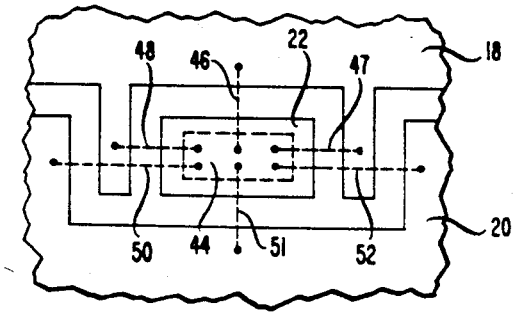
FIG. 3 represents a portion of the FIG. 2 assembly in the immediate vicinity of one of the component chips thereof.

One standard way of achieving the aforementioned decoupling capacitors is schematically suggested in FIG. 3 which in enlarged form shows portions of the power and ground conductors 18 and 20 in the immediate vicinity of the mounted chip 22 of FIG. 2. In particular, FIG. 3 represents a decoupling capacitor underlying the chip 22. This capacitor is shown in dashed outline and designated by reference numeral 44.

One way of achieving the decoupling capacitor 44 (FIG. 3) is to form two metal plates under the ship 22 separated by a dielctric layer of silicon dioxide, tantalum oxide, or other suitable dielectric. (By way of illustrative example herein, a single layer of silicon dioxide will be specified.) Alternatively, the bottom plate of such a capacitor may be formed by suitably doping a localized portion of the underlying wafer. In either case, the silicon dioxide thickness required to realize the required decoupling capacitance in such a small-area capacitor is typically only about 400 Angstrom units (Å).

But, in practice, it has been found that 400-Å-thick layers of silicon dioxide in capacitor structures in a WSI assembly of the type represented in FIGS. 1 through 3 are characterized by troublesome pin-holes. In turn, these pin-holes can fill up with metal and thereby cause plate-to-plate shorts in the capacitor structure. The occurrence of such pin-holes in the capacitor dielectric has been determined to be a significant factor standing in the way of economically achieving highly reliable high-speed assemblies.

Additionally, it is necessary in a standard WSI assembly of the type described herein to connect the plates of each under-chip decoupling capacitor to the adjacent power and ground conductors of the assembly. Thus, as schematically shown in FIG. 3, multiple leads are lithographically defined to connect the respective plates of the capacitor 44 to the power and ground conductors 18 and 20. By way of example, leads 46 through 48 connect one plate of the capacitor 44 to the power conductor 18, and leads 50 through 52 connect the other plate of the capacitor to the ground conductor 20.

The inductance of even relatively short leads such as the leads 46 through 48 and 50 through 52 of FIG. 3 can be limiting in a high-performance WSI assembly. In particular, the inductance of these leads can impose an undesirable limit on the high-speed operating capabilities of the assembly.

Figure 4:
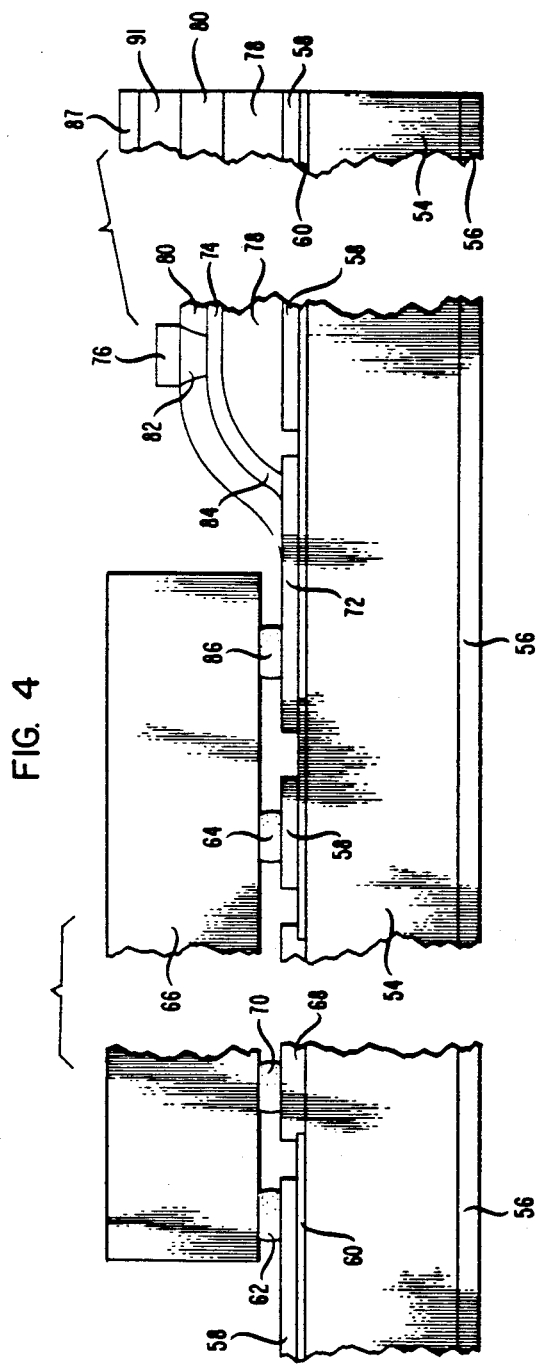
FIG. 4 shows the details of a portion of a specific illustrative WSI assembly made in accordance with the pinciples of the present invention.

FIG. 4 shows a portion of a specific illustrative WSI assembly made in accordance with the principles of the present invention. As will be described in detail below, this illustrative assembly is characterized by several significant and advantageous properties compared to the standard assembly described above and shown in FIGS. 1 through 3.

Illustratively, the FIG. 4 assembly comprises a square single-crystal silicon wafer 54 about 500 μm thick and measuring approximately 7.5 cm on a side. In accordance with a feature of the present invention, the wafer 54 is highly doped to render it relatively conductive. By way of a specific illustrative example, the wafer 54 is doped with an n-type impurity such as arsenic to a level of approximately $10^{19}$ atoms per cubic centimeter. Advantageously, this doping is done at the time of forming the silicon ingot from which the wafer is subsequently cut. Such doping imparts a relatively low resistivity of approximately 0.006 ohm-centimeter to the wafer 54. In practice, though, it is contemplated that wafer resistivities less than approximately 0.01 ohm-centimeter will suffice for many applications.

In accordance with another feature of the principles of the present invention, a conductive layer 56 such as a 2-μm-thick layer of aluminum is deposited on the entire bottom surface of the wafer 54 of FIG. 4. The planar layer 56 functions as a continuous ground conductor for the depicted assembly and, additionally, constitutes a part of one plate of a wafer-size decoupling capacitor included in the assembly.

Advantageously, the metallic layer 56 (FIG. 4) is deposited on the bottom surface of the wafer 54 during the same processing step in which a layer of the same material and thickness is being deposited on or overlying the top surface of the wafer 54. Thus, by way of example, the aforementioned 2-μm-thick aluminum layer 56 is deposited at the same time that layer 58 of the assembly is being deposited. The layer 58 constitutes a large-area planar power conductor. The planar nature of the power conductor is typically interrupted only in regions immediately under mounted chips or in regions directly adjacent thereto, as will be evident from the description later below.

Significantly, because the layers 56 and 58 (FIG. 4) are deposited at the same time and on opposite sides of the wafer 54, the likelihood of bowing occurring in the wafer 54 during or after deposition is substantially reduced. This advantageous result stems from the fact that the layers 56 and 58 subject the wafer 54 to forces that tend to counterbalance each other. As a result, no net force or no appreciable net force acts to distort the planar top surface of the wafer 54.

A dielectric layer 60 comprising, for example, a 1500-Å-thick layer of thermally grown silicon dioxide directly underlies a major extent of the conductive layer 58. Because of its relative thickness (compared, for example, to 400 Å) the layer 60 constitutes an excellent virtually pin-hole-free dielectric.

However, even if the relatively thick dielectric layer 60 cannot be made perfectly pin-hole free over such large areas, it is feasible in practice easily to repair a capacitor structure that includes such a dielectric. This is done, for example, by applying a controlled current to the structure sufficient to vaporize any metal filling the pin-holes.

The layer 60 of FIG. 4 comprises the dielectric of a large-area decoupling capacitor whose upper plate is the power conductor 58. As mentioned above, the lower plate of this capacitor includes the highly doped wafer 54 and the ground conductors 56. The large-area nature of this capacitor permits the dielectric layer to be relatively thick (1500 Å) while the structure still achieves the required large value of decoupling capacitance.

In effect, the aforedescribed capacitor is distributed over virtually the entire extent of the wafer 54 of FIG. 4. Whenever the power conductor 58 extends, there is formed an underlying decoupling capacitor. Thus, whenever a connection is made between a bonding pad on a mounted chip and the power conductor 58, decoupling capacitance is connected directly to the pad at the same time. This is illustrated in FIG. 4 wherein solder balls 62 and 64 are shown interposed between pads on chip 66 and portions of the power conductor 58. (In practice, multiple such power connections are typically made between each chip and the conductor 58.) The only "leads" between the pads and the aforedescribed wafer-size capacitor are the solder balls themselves which inherently possess very little inductance. Also, the magnitude of the fringing fields of such a large-area capacitor is less than that of the fields associated with multiple discrete small-area capacitors of the type heretofore proposed. Hence, the depicted capacitor exhibits advantageous high-speed characteristics.

Illustratively, lithographically defined interruptions in the power conductor 58 of FIG. 4 occur directly under the chip 66. One such type of interruption is made to achieve ground connections between pads on the chip 66 and the ground conductor 56. Thus, as indicated in FIG. 4, a portion of the dielectric layer 60 is removed from the top surface of the wafer 54 before the power conductor layer is deposited thereon. Subsequently, the power conductor layer is patterned to provide isolated metallic regions such as region 68.

Since the conductive region 68 rests directly on the highly doped wafer 54 which in turn has the ground conductor 56 formed on the bottom surface thereof, the region 68 constitutes a top-surface ground portion in the depicted WSI assembly. Thus, solder ball 70 is effective to connect a mating pad on the chip 66 to ground in an effective relatively low-inductance manner. In practice, multiple such ground connections are made between each chip and the ground conductor 56.

In one specific illustrative embodiment of applicants' invention, each ground connection such as the region 68 of FIG. 4 is designed to have a relatively large-area top surface measuring about 1.25 mm on a side. As a result, the resistance measured between the region 68 and the ground conductor 56 is relatively low (in one specific example, only about 19 milliohms). Additionally, since, as mentioned above, each chip typically includes multiple such ground connections, the net overall resistance of multiple parallel ground paths through the wafer 54 to the bottom-surface conductor 56 is many times lower. In one specific illustrative example in which eight such ground connections are provided to each chip, the net resistance between the ground connections associated with each chip and the bottom-surface conductor 56 measures only about 2.4 milliohms.

But, in accordance with the principles of the present invention, it is to be understood that doping levels other than the one specifically mentioned above can impart the requisite electrical characteristic to the wafer 54 of FIG. 4. The significant requirement is that the wafer 54 be doped to be sufficiently conductive to constitute an effective power supply connection between conductive connections on the top surface of the wafer and the bottom-surface conductor 56. In each case, it is well known that the requisite conductivity of such an interconnection is in turn a function of such factors as the particular technology from which the chips of the WSI assembly is made, the required noise margins of the chip circuits, the specified operating power levels of the chip circuits, etc. It can be appreciated that it is feasible also simply to dope heavily only selected portions of the wafer to permit high conductivity between metallic regions 68 and the bottom surface layer 56 in those instances where for some reasons it is desirable to limit the conductivity of portions of the wafer 54.

Another type of lithographically defined interruption in the deposited power conductor layer is represented in FIG. 4. This type of interruption provides isolated metallic regions on the dielectric layer 60. These regions are the instrumentalities by which X- and Y-signal leads are connected to bonding pads on the mounted chips. One such region 72 is shown in FIG. 4.

FIG. 4 also shows one conductor 74 of multiple X-signal leads and one conductor 76 of multiple Y-signal leads included in the illustrative WSI assembly. By way of example, these leads are lithographically defined in a conductive material such as aluminum. Each such lead is typically about 2 μm thick and 10-to-20 μm wide.

A dielectric layer 78 (FIG. 4) is interposed between the X-signal leads including the conductor 74 and the conductive layer that includes the regions 58, 68 and 72. Further, another dielectric layer 80 isolates the X-signal metallization level from the Y-signal metallization level. Illustratively, each of these dielectric layers comprises a 5-to-20 μm-thick layer of polyimide material. Such a relatively thick low-dielectric-constant material ensures that the X- and Y-signal leads have relatively low values of parasitic capacitance associated therewith. Significantly, this enhances the high-speed performance characteristics of the unique depicted assembly.

By way of a specific example wherein two signal leads at different levels are designed to be connected together and then connected to a pad on the chip 66 of FIG. 4, the Y-signal conductor 76 is shown connected by a metallic via 82 to the X-signal conductor 74. In turn, the conductor 74 is connected to the region 72 by a conductive portion 84. In that way, the conductors 74 and 76 are electrically connected together and to the region 72. Further, solder ball 86 connects the region 72 to a specified one of the bonding pads included on the chip 66.

A significant advantage of the specific illustrative FIG. 4 assembly is that the signal leads thereof are designed wherever possible to overlie uninterrupted portions of the large-area conductor 58 which therefore constitutes in effect a continuous a-c ground plane. As a result, signals propagated in these overlying leads are minimally distorted.

FIG. 4 also schematically indicates that the depicted WSI assembly includes input/output terminals. One such illustrative terminal 87 overlying insulating layer 91 is shown disposed along one edge of the assembly. By means of such terminals, the WSI assembly can be connected to other such assemblies and/or to other equipment included in a system configuration.

The illustrative structure schematically represented in FIG. 4 constitutes only a one-chip portion of an overall WSI assembly made in accordance with the principles of the present invention. In some applications of practical importance, as many as 100 chips are mounted and interconnected in such an assembly. The chips in a particular assembly may comprise only bipolar devices, metal-oxide-semiconductor (MOS) devices, complementary-MOS devices, laser devices, integrated-optical devices, etc., or a mixture of some or all of such different devices.

Figure 5:
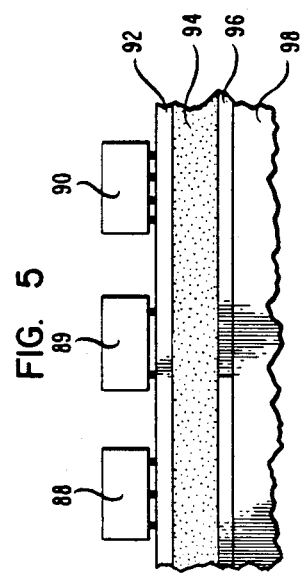
FIG. 5 is a generalized overall schematic representation of a larger portion of the FIG. 4 assembly.

FIG. 5 illustrates an inventive assembly that includes three chips 88 through 90. Layer 92 schematically represents the particular three-level metallization described above in connection with FIG. 4. Wafer 94 is indicated by dots as being relatively highly doped, as specified above. And layer 96 represents applicants' unique bottom-surface ground conductor. Lastly, the entire WSI assembly is schematically depicted as being supported on a base member 98 which is part of a package that includes, for example, contacting and cooling capabilities.

Finally, it is to be understood that the above-described structures and techniques are only illustrative of the principles of the present invention. In accordance with these principles, numerous modifications and alternatives may be devices by those skilled in the art without departing from the spirit and scope of the invention. For example, although emphasis herein has been placed on mounting chips in a WSI assembly by face-down solder-ball bonding, it is to be understood that applicants' inventive principles are also applicable to assemblies in which other chip mounting techniques are employed. Thus, the chips may be mounted face-up on a wafer and connections made between the chips and the wafer by standard wire-bonding or tape-automated-bonding techniques. Or the chips may be mounted in sloped-wall recesses formed in the wafer or may be fabricated as integral parts of the wafer itself. In these latter cases, the connections between the chips and the metallization pattern on the wafer may be lithographically formed.

Additionally, in some cases it may be advantageous to employ the bottom-surface conductor of the assembly as a power plane and to utilize the large-area metallization on and overlying the top surface of the wafer as a ground plane.

Furthermore, although silicon constitutes a particularly advantageous material from which to fabricate the herein-considered WSI assemblies, it is to be understood that other avilable materials can be used as the basis for making assemblies of the type specified. Gallium arsenide, for example, constitutes one such attractive alternative material.

Also, although it is particularly advantageous, for the various reasons specified herein, that the conductor 56 (FIG. 4) be formed on the bottom surface of the wafer 54, applicants' inventive principles also encompass the case in which the conductor 56 is formed instead directly on the top surface of the wafer. The remainder of the structure overlying such a top-surface conductor is the same as described above and shown in FIG. 4 with a dielectric layer 60 separating the top-surface layer 56 from layer 58. Such an alternative structure also provides a readily accessible large-area decoupling capacitor in a WSI assembly.

Additionally, it is feasible to deposit a conductive layer over the opposite or top surface of each face-down-mounted chip to provide connection to the substrate portion of each chip, since it is often desirable to maintain such substrate at a specified potential.

Further, although emphasis herein has been directed to making direct electrical connections between chip bonding pads and patterned portions of the power conductor layer (as specifically indicated in FIG. 4), it is also feasible to utilize various alternatives to make these connections. For example, in one such alternative arrangement, chips are mounted in the assembly farther above the top surface of the wafer 54. In that case, the chip bonding pads are directly connected to respective upper portions of the multilayer conductive pattern. These portions are above and insulated from the power conductor layer. Conductive vias or other structures are then utilized to connect these upper portions to respective portions of the power conductor layer.

Additionally, it is apparent that dielectric materials or combinations of dielectric materials other than those specifically mentioned above may be utilized to form the layers 60, 78, 80 and 91 of the assembly shown in FIG. 4.

What is claimed is:

1. A wafer-scale-integrated assembly comprising
   a wafer having top and bottom surfaces,
   a first large-area conductive layer on the bottom surface of said wafer, said layer constituting a first power-supply-connection layer,
   spaced-apart conductive power-supply-connection regions in electrical contact with a minor portion of the top surface of said wafer,
   said wafer being sufficiently conductive to provide an effective low-resistance connection between said conductive regions on the top surface of said wafer and said conductive layer on the bottom surface of said wafer,
   a dielectric layer directly on the top surface of said wafer except where said conductive regions contact said top surface,
   a second large-area conductive layer on a major portion of the top surface of said dielectric layer, said second layer being spaced apart from said conductive regions and constituting a second power-supply-connection layer,
   said first layer and said wafer constituting one plate of a large-area capacitor, said dielectric layer constituting the dielectric of said capacitor and said second conductive layer constituting the other plate of said capacitor,
   plural circuit chips each including power supply contacts,
   and means connecting some of the power supply contacts of each chip to respective ones of said conductive regions and others of said power supply contacts to said second conductive layer, whereby power supply contacts of each chip are thereby connected to said first and second power-supply-connection layers and to said large-area capacitor.

2. An assembly as in claim 1 wherein each of said chips includes signal contacts, said assembly further comprising
   spaced-apart conductive signal regions on a minor portion of the top surface of said dielectric layer,
   and means connecting signal contacts of said chips to said signal regions.

3. An assembly as in claim 2 wherein said wafer and said chips exhibit a matched coefficient of thermal expansion.

4. An assembly as in claim 3 wherein said wafer and said chips are substantially of semiconductive material.

5. An assembly as in claim 4 wherein said material is silicon.

6. An assembly as in claim 5 wherein said wafer comprises highly doped single-crystal silicon.

7. A wafer-scale-integrated assembly comprising
   a wafer having integrated-circuit chips mounted on or in a top surface of said wafer, each of said chips including specific conductive regions,
   and a conductive pattern overlying said surface of said wafer, said pattern including portions connected to said specific regions and other portions constituting terminals of said assembly,
   wherein the improvement comprises a conductive layer on the bottom surface of said wafer and said wafer is sufficiently conductive to constitute an effective electrical connection between said conductive layer and said pattern portions connected to the specific regions of said chips.
   and wherein portions of said conductive pattern are in direct electrical contact with the top surface of said wafer thereby providing a connection via said wafer to said conductive layer on the bottom surface of said wafer.

8. An assembly as in claim 7 wherein said top surface contains thereon a dielectric layer except where said portions of the conductive pattern are in direct contact with the top surface of said wafer.

9. An assembly as in claim 8 wherein said conductive pattern includes spaced-apart relatively small-area portions insulated from each other on said dielectric layer and a continuous relatively large-area portion covering a major extent of said dielectric layer.

10. An assembly as in claim 9 wherein said large-area portion and said conductive layer comprise power and ground conductors of said assembly, and wherein said large-area portion, said dielectric layer and said wafer together with said conductive layer comprise, respectively, one plate, the dielectric and the other plate of a decoupling capacitor of said assembly.

11. An assembly as in claim 10 wherein said conductive pattern includes X-signal leads and Y-signal leads in spaced-apart levels insulated from each other.

12. An assembly as in claim 11 wherein said wafer comprises a doped semiconductive material and each of said devices comprises a semiconductive material, wherein said dielectric layer comprises a relatively thin layer of silicon dioxide, and wherein said X-signal and Y-signal leads are insulated from each other and from underlying conductive portions by relatively thick layers of a material having a relatively low dielectric constant.

13. An assembly as in claim 12 wherein said low-dielectric-constant material comprises a polyimide material.

14. An assembly as in claim 13 wherein said devices are mounted face-down with respect to the top surface of said wafer, and wherein the pattern portions connected to the conductive regions of said devices are connected thereto with solder.

15. A wafer-scale-integrated assembly comprising
a conductive wafer comprising a doped semiconductive material,
a conductive layer on the bottom surface of said wafer,
a dielectric layer on all but specified surface regions of the top surface of said wafer,
a patterned conductive layer overlying said dielectric layer and said specified surface regions, said conductive layer including a large-area region overlying a major extent of the top surface of said dielectric layer, first isolated regions in contact with said specified surface regions and second isolated regions overlying said dielectric layer,
an isolated signal lead interconnection pattern on said wafer overlying said conductive layer,
means connecting selected ones of said signal leads to said second regions,
plural semiconductive chips each including contacts,
and means mounting said chips overlying the top surface of said wafer and respectively connecting selected ones of said contacts to said large-area region, to said first isolated regions and to said second isolated regions.

16. An assembly as in claim 15 wherein said wafer comprises silicon.

17. An assembly as in claim 16 wherein said silicon wafer is doped with an n-type impurity.

18. An assembly as in claim 17 wherein the concentration of said n-type impurity is at least approximately $10_{19}$ atoms per cubic centimeter.

19. An assembly as in claim 18 wherein said n-type impurity comprises arsenic.

20. An assembly as in claim 19 wherein said bottom-surface conductive layer comprises aluminum.

21. An assembly as in claim 20 wherein said dielectric layer comprises silicon dioxide.

22. An assembly as in claim 21 wherein said chips comprise silicon.

23. An assembly as in claim 22 wherein said mounting and connecting means comprise solder interposed between said chip contacts and said specified regions.

24. A wafer-scale-integrated assembly comprising
a wafer having a resistivity less than approximately 0.01 ohm-centimeter,
a conductive electrode on the bottom surface of said water,
a dielectric layer on all but selected surface portions of the top surface of said wafer,
a continuous conductive electrode on all but selected surface portions of the top surface of said dielectric layer,
first conductive regions on the selected surface portions of the top surface of said wafer and spaced apart from said continuous electrode,
second conductive regions on the top surface of said dielectric layer and spaced apart from said continuous electrode and from said first conductive regions,
multiple integrated-circuit devices each having power supply terminals and signal terminals,
and means connecting specified ones of said power supply terminals of each device to said continuous electrode, others of said power supply terminals of each device to said first conductive regions and the remaining terminals of each device to said second conductive regions.

25. An assembly as in claim 24 wherein said devices are mounted face-down overlying the top surface of said wafer, and wherein said specified connections are made with solder.

26. A wafer-scale-integrated assembly comprising
a wafer,
a conductive layer directly on and covering substantially the entirety of one of the main planar surfaces of said wafer, the resulting wafer-layer structure having a top surface and a bottom surface, said layer comprising a first power supply conductor of said assembly,
a dielectric layer overlying all but specified regions of said top surface,
a large-area conductive layer overlying a major portion of the top surface of said dielectric layer, said large-area layer comprising a second power supply conductor of said assembly.
small-area conductive portions spaced apart from said large-area conductive layer on the top surface of said structure in said respective specified regions,
multiple integrated-circuit chips included in said assembly, each chip including power supply terminal regions,
and means connecting some of the power supply terminal regions of each chip to said large-area conductive layer and other of said power supply terminal regions of each chip to respective ones of said small-area conductive portions,
whereby each chip is thereby connected to said first and second power supply conductors of said assembly and at the same time is connected to a large-area capacitor that includes said first-mentioned layer, said large-area conductive layer and said dielectric layer.

27. An assembly as in claim 26 wherein said first-mentioned conductive layer is on the bottom surface of said wafer and said wafer comprises a material that is sufficiently conductive to constitute an effective power supply connection between said first-mentioned layer and said small-area conductive portions.

28. An assembly as in claim 27 wherein said wafer comprises doped silicon and each of said chips comprises silicon.

29. A wafer-scale-integrated assembly comprising
a large-area silicon wafer,
a plurality of silicon chips supported on the top surface of said wafer,
and means interconnecting said chips,
said interconnecting means comprising a first conductive layer on the bottom surface of said wafer and a second segmented conductive layer on the top surface of said wafer, said second conductive layer including first segments which make direct electrical contact with the top surface of the wafer and a second segment which is dielectrically isolated from the top surface of the wafer, the wafer being conductive at least at those portions where the first segments overly the wafer thereby to permit low-resistance connection between said first segments and the first conductive layer, and wherein each chip includes contact regions some of which make low-resistance electrical connections to said first segments and others of which make low-resistance electrical connections to the second segment.

30. An assembly as in claim 29 wherein the first conductive layer and the second segment are adapted to be maintained at different electrical potentials for powering said chips.

31. A wafer-scale-integrated assembly comprising
a wafer,
a conductive layer on one of the main planar surfaces of said wafer, the resulting wafer-layer structure having a top surface and a bottom surface, said layer comprising a first power supply conductor of said assembly,
a dielectric layer overlying all but specified regions of said top surface,
a large-area conductive layer overlying a major portion of the top surface of said dielectric layer, said large-area comprising a second power supply conductor of said assembly,
small-area conductive portions spaced apart from said large-area conductive layer on the top suface of said structure in said respective specified regions,
multiple inegrated-circuit chips included in said assembly, each chip including power supply terminal regions,
and means connecting some of the power supply terminal regions of each chip to said large-area conductive layer and others of said power supply terminal regions of each chip to respective ones of said small-area conductive portions,
whereby each chip is thereby connected to said first and second power supply conductors of said assembly and at the same time is connected to a large-area capacitor that includes said first-mentioned layer, said large-area conductive layer and said dielectric layer,
and wherein said first-mentioned conductive layer is on the bottom surface of said wafer and said wafer comprises a material that is sufficiently conductive to constitute an effective power supply connection between said first-mentioned layer and said small-area conductive portions.

32. An assembly as in claim 31 wherein said wafer comprises doped silicon and each of said chips comprises silicon.

* * * * *

UNITED STATES PATENT AND TRADEMARK OFFICE
CERTIFICATE OF CORRECTION

PATENT NO. : 4,675,717
DATED : June 23, 1987
INVENTOR(S) : Victor Herrero and Leonard W. Schaper It is certified that error appears in the above-indentified patent and that said Letters Patent is hereby corrected as shown below:

On the title page, item [54] and in column 1, line 2, in the title "WATER" should read --WAFER--.

Signed and Sealed this

Fifteenth Day of March, 1994

Attest:

BRUCE LEHMAN

*Attesting Officer*     *Commissioner of Patents and Trademarks*